United States Patent
Kuo et al.

(10) Patent No.: US 8,456,348 B2
(45) Date of Patent: Jun. 4, 2013

(54) SAR ADC CAPABLE OF REDUCING ENERGY CONSUMPTION

(75) Inventors: Chien-Hung Kuo, Taipei (TW); Cheng-En Hsieh, Kaohsiung (TW)

(73) Assignee: National Taiwan Normal University, Taipei (TW)

( * ) Notice: Subject to any disclaimer, the term of this patent is extended or adjusted under 35 U.S.C. 154(b) by 76 days.

(21) Appl. No.: 13/240,787

(22) Filed: Sep. 22, 2011

(65) Prior Publication Data
US 2013/0076553 A1    Mar. 28, 2013

(51) Int. Cl.
*H03M 1/46* (2006.01)
*H03M 1/80* (2006.01)

(52) U.S. Cl.
CPC .............. *H03M 1/466* (2013.01); *H03M 1/804* (2013.01)
USPC .......................................... 341/172; 341/150

(58) Field of Classification Search
CPC ........ H03M 1/466; H03M 1/802; H03M 1/804
USPC ........................... 341/150, 161, 162, 163, 172
See application file for complete search history.

(56) References Cited

U.S. PATENT DOCUMENTS

| | | | | |
|---|---|---|---|---|
| 7,528,761 | B2 * | 5/2009 | Draxelmayr | 341/172 |
| 7,777,662 | B2 * | 8/2010 | Meynants et al. | 341/163 |
| 2004/0075601 | A1 * | 4/2004 | Carreau et al. | 341/172 |
| 2013/0015996 | A1 * | 1/2013 | Furuta et al. | 341/172 |

OTHER PUBLICATIONS

Chang, Y-K. et al., A 8-bit 500-KS/s Low Power SAR ADC for Bio-Medical Applications, IEEE Asian Solid-State Circuits Conference, Nov. 2007, pp. 228-231.*
Ginsburg, B. et al., An Energy-Efficient Charge Recycling Approach for a SAR Converter With Capacitive DAC, Circuits and Systems, 2005. ISCAS 2005. IEEE International Symposium on, May 2005, pp. 184-187 vol. 1.*
Kuo, C.H. et al., Floating capacitor switching SAR ADC, Jun. 2011, Electronics Letters, vol. 47, No. 13, pp. 742-743.*
Lin J. et al. Multi-step capacitor-splitting SAR ADC, Electronics Letters, Oct. 2010, vol. 46 , Issue: 21 pp. 1426-1428.*

\* cited by examiner

*Primary Examiner* — Howard Williams
(74) *Attorney, Agent, or Firm* — Tracy M. Heims; Apex Juris, PLLC

(57) ABSTRACT

An SAR ADC capable of reducing energy consumption, including a voltage selecting circuit for configuring a capacitor circuit to form a first equivalent capacitor having a capacitance of $(2m-1)C$, a second equivalent capacitor having a capacitance of $(2^n-2m-1)C$, a fourth equivalent capacitor having a capacitance of $(2m-1)C$, and a fifth equivalent capacitor having a capacitance of $(2^n-2m-1)C$, wherein, the first equivalent capacitor has one terminal coupled to a reference voltage or a ground voltage, and the other terminal coupled to a positive input end of a comparator; the second equivalent capacitor is coupled between a common mode voltage and the positive input end; the fourth equivalent capacitor has one terminal coupled to the ground voltage or the reference voltage, and the other terminal coupled to a negative input end of the comparator; and the fifth equivalent capacitor is coupled between the common mode voltage and the negative input end.

7 Claims, 5 Drawing Sheets

SAR ADC CAPABLE OF REDUCING ENERGY CONSUMPTION

BACKGROUND OF THE INVENTION

1. Field of the Invention

The present invention relates to an SAR ADC (Successive Approximation Register Analog-to-Digital Converter), especially to an SAR ADC capable of minimizing energy consumption.

2. Description of the Related Art

As portable electronic products have evolved vigorously, low power consumption—capable of prolonging the battery life—has become a key issue in the design of electronic products; and among the varieties of analog-to-digital converters, the SAR ADC has been widely used in electronic products due to its power saving advantage—its analog-to-digital conversion is implemented by a simple architecture including only a comparator and few components.

Please refer to FIG. 1, which illustrates the block diagram of a prior art N-bit SAR ADC. As illustrated in FIG. 1, the SAR ADC includes a bit value determination unit 100, and a successive approximation register 140, wherein the bit value determination unit 100 includes a sample and hold circuit 110, a digital-to-analog conversion circuit 120, and a comparator 130.

The sample and hold circuit 110 is used for performing a sample and hold operation on an analog input signal $V_A$ to generate a sampled signal $V_{A1}$ during a sampling stage.

The digital-to-analog conversion circuit 120, biased between a reference voltage $V_{REF}$ and a ground voltage $V_{GND}$, is used for generating a quantization voltage $V_{A2}$ according to switch control signals $SW_N \ldots SW_1$.

The comparator 130 is used for comparing the sampled signal $V_{A1}$ with the quantization voltage $V_{A2}$ to generate a bit output B.

The successive approximation register 140 is used for successively changing the content of the switch control signals $SW_N \ldots SW_1$ during a voltage comparison stage to vary the quantization voltage $V_{A2}$, and successively receiving the bit output B to generate a digital output code $D_{OUT}$.

During the voltage comparison stage, first, the successive approximation register 140 will output a prediction code through the switch control signals $SW_N \ldots SW_1$ to cause a charging or discharging process happening in the digital-to-analog conversion circuit 120, so as to generate a corresponding level for the quantization voltage $V_{A2}$. Second, the comparator 130 will compare the sampled voltage $V_{A1}$ with the quantization voltage $V_{A2}$, and thereby determine the content of the bit output B—"0" or "1". Third, the successive approximation register 140 will store the bit output B in a register, and output a next prediction code according to the content of the bit output B to determine the next content of the bit output B. By repeating the three steps N times, an N bits content of the digital output code $D_{OUT}$ corresponding to the sampled signal $V_{A1}$ will be generated.

In the process of generating the digital output code $D_{OUT}$, the quantization voltage $V_{A2}$ generated by the digital-to-analog conversion circuit 120 will successively approach the sampled signal $V_{A1}$ in a binary-weighted manner; that is, an N bits SAR ADC will generate N values of the quantization voltage $V_{A2}$—let them labeled as $V_{A2(1)}, V_{A2(2)}, V_{A2(3)}, \ldots, V_{A2(N)}$ respectively, and the voltage difference between $V_{A2(k)}$ and $V_{A2(k-1)}$ will be half of the voltage difference between $V_{A2(k-1)}$ and $V_{A2(k-2)}$, wherein k=3 to N.

As the digital-to-analog conversion circuit 120 normally uses a plurality of switches to control the charging or discharging of a plurality of capacitors of different weightings, therefore, most energy will be dissipated in the charging or discharging of the capacitors.

For the architecture of general digital-to-analog conversion circuits, please refer to FIG. 2, which illustrates the block diagram of a prior art bit value determination unit including a digital-to-analog conversion circuit. As illustrated in FIG. 2, the prior art bit value determination unit includes a switch unit 210, a digital-to-analog conversion circuit 220, and a comparator 230, wherein the digital-to-analog conversion circuit 220 has a first capacitor array 221, a second capacitor array 222, a voltage selecting circuit 223, and a voltage selecting circuit 224.

The switch unit 210 has a pair of sampling switches, of which one side has a first contact and a second contact, and both the first contact and the second contact are coupled to a reference voltage $V_{REF}$; and the other side has a third contact and a fourth contact coupled to the first capacitor array 221 and the second capacitor array 222 respectively.

The first capacitor array 221 and the second capacitor array 222 both have N+1 capacitors, with capacitances of C, C, 2C, 4C, 8C, $\ldots$, $2^{N-1}C$ respectively. The N+1 capacitors of the first capacitor array 221 has a common terminal coupled to the third contact of the switch unit 210, and N+1 bias contacts coupled to the voltage selecting circuit 223. The N+1 capacitors of the second capacitor array 222 has a common terminal coupled to the fourth contact of the switch unit 210, and N+1 bias contacts coupled to the voltage selecting circuit 224.

The voltage selecting circuit 223 is used for outputting N+1 bias voltages for the N+1 bias contacts of the first capacitor array 221 according to switch control signals $SW_N \ldots SW_1$, wherein, each of the bias voltages outputted by the voltage selecting circuit 223 is selected from a group consisting of a negative analog input voltage $V_{AN}$, the reference voltage $V_{REF}$, and a ground voltage $V_{GND}$. The voltage selecting circuit 224 is used for outputting N+1 bias voltages for the N+1 bias contacts of the second capacitor array 222 according to the switch control signals $SW_N \ldots SW_1$, wherein, each of the bias voltages outputted by the voltage selecting circuit 224 is selected from a group consisting of a positive analog input voltage $V_{AP}$, the reference voltage $V_{REF}$, and the ground voltage $V_{GND}$.

The comparator 230 has a positive input end, a negative input end, and an output end, wherein the positive input end is coupled to the third contact of the switch unit 210, and the negative input end is coupled to the fourth contact of the switch unit 210. The comparator 230 is used for generating a bit output B according to the voltage difference between the positive input end and the negative input end—the voltage difference can be expressed as $V_{AP}-V_{AN}-\gamma V_{REF}$, wherein $0 \leq \gamma < 1$. When $V_{AP}-V_{AN}-\gamma V_{REF} > 0$, B=1; and when $V_{AP}-V_{AN}-\gamma V_{REF} < 0$, B=0.

Please refer to FIG. 3, which illustrates a circuit of the prior art bit value determination unit of FIG. 2 formed in a sampling stage. As illustrated in FIG. 3, when in the sampling stage, both the common contact of the first capacitor array 221 and the common contact of the second capacitor array 222 are coupled to $V_{REF}$, the N+1 bias contacts of the first capacitor array 221 are coupled to the negative analog input voltage $V_{AN}$, and the N+1 bias contacts of the second capacitor array 222 are coupled to the positive analog input voltage $V_{AP}$. By the end of the sampling stage, the first capacitor array 221 will store a voltage of $(V_{REF}-V_{AN})$, and the second capacitor array 222 will store a voltage of $(V_{REF}-V_{AP})$.

Please refer to FIG. 4, which illustrates another circuit of the prior art bit value determination unit of FIG. 2 formed in a voltage comparison stage. As illustrated in FIG. 4, when in the voltage comparison stage, the switch unit 210 is switched off; the first capacitor array 221 has a first equivalent capacitor with a capacitance of KC and a second equivalent capacitor with a capacitance of $(2^N-K)C$; the second capacitor array 222 has a third equivalent capacitor with a capacitance of KC and a fourth equivalent capacitor with a capacitance of $(2^N-K)C$, wherein, both K and N are positive integers, K=1 to $2^N-1$; the bias contact of the first equivalent capacitor is coupled to $V_{REF}$; the bias contact of the second equivalent capacitor is coupled to $V_{GND}$; the bias contact of the third equivalent capacitor is coupled to $V_{GND}$; the bias contact of the fourth equivalent capacitor is coupled to $V_{REF}$.

During the voltage comparison stage, the comparator 230 will see a voltage of $V_{REF}-V_{AN}+(K/2^N)V_{REF}$ at the positive input end, and a voltage of $V_{REF}-V_{AP}+(1-K/2^N)V_{REF}$ at the negative input end, i.e., a voltage difference of $V_{AP}-V_{AN}-(1-K/2^N)V_{REF}$ between the positive input end and the negative input end. Taking N=4 as an example, wherein:

when K=1, the voltage difference will be $V_{AP}-V_{AN}-(7/8)V_{REF}$;
when K=2, the voltage difference will be $V_{AP}-V_{AN}-(3/4)V_{REF}$;
when K=3, the voltage difference will be $V_{AP}-V_{AN}-(5/8)V_{REF}$;
when K=4, the voltage difference will be $V_{AP}-V_{AN}-(1/2)V_{REF}$;
when K=5, the voltage difference will be $V_{AP}-V_{AN}-(3/8)V_{REF}$;
when K=6, the voltage difference will be $V_{AP}-V_{AN}-(1/4)V_{REF}$;
when K=7, the voltage difference will be $V_{AP}-V_{AN}-(1/8)V_{REF}$;
when K=8, the voltage difference will be $V_{AP}-V_{AN}-0$;
when K=9, the voltage difference will be $V_{AP}-V_{AN}-(-1/8)V_{REF}$;
when K=10, the voltage difference will be $V_{AP}-V_{AN}-(-1/4)V_{REF}$;
when K=11, the voltage difference will be $V_{AP}-V_{AN}-(-3/8)V_{REF}$;
when K=12, the voltage difference will be $V_{AP}-V_{AN}-(-1/2)V_{REF}$;
when K=13, the voltage difference will be $V_{AP}-V_{AN}-(-5/8)V_{REF}$;
when K=14, the voltage difference will be $V_{AP}-V_{AN}-(-3/4)V_{REF}$;
when K=15, the voltage difference will be $V_{AP}-V_{AN}-(-7/8)V_{REF}$.

During the voltage comparison stage, K is initially set at 8 to compare $V_{AP}-V_{AN}$ with 0, and if $V_{AP}-V_{AN}$ is higher than 0, K will be changed to 4 to compare $V_{AP}-V_{AN}$ with $(1/2)V_{REF}$, and if $V_{AP}-V_{AN}$ is lower than $(1/2)V_{REF}$, K will be changed to 6 to compare $V_{AP}-V_{AN}$ with $(1/4)V_{REF}$, and so forth. When K=8, (the first equivalent capacitor, the second equivalent capacitor) will form a combination of (8C, 8C); when K=4, (the first equivalent capacitor, the second equivalent capacitor) will form a combination of (4C, 12C); and when K=6, (the first equivalent capacitor, the second equivalent capacitor) will form a combination of (6C, 10C).

Therefore, assume $V_{AP}-V_{AN}=(9/32)V_{REF}$, then the comparator 230 will output "1" when K is initially set at 8—because $(9/32)V_{REF}-0$ is higher than 0, and K will then be changed to 4; when K is at 4, the comparator 230 will output "0"—because $(9/32)V_{REF}-(1/2)V_{REF}$ is lower than 0, and K will then be changed to 6; when K is at 6, the comparator 230 will output "1"—because $(9/32)V_{REF}-(1/4)V_{REF}$ is higher than 0, and K will then be changed to 5; when K is at 5, the comparator 230 will output "0"—because $(9/32)V_{REF}-(3/8)V_{REF}$ is lower than 0. In this manner, a digital code (1010) corresponding to $(9/32)V_{REF}$ will be generated.

Besides, as there are N occurrences of dynamic energy consumption in the N bits SAR ADC during the generation of each N bits digital code, wherein the energy consumed in each occurrence of the dynamic energy consumption is equal to the product of the reference voltage $V_{REF}$ and the charge flowing out of the reference voltage $V_{REF}$, therefore, given a specified value of the reference voltage $V_{REF}$, the charge flowing out of the reference voltage $V_{REF}$ has to be reduced to minimize the dynamic energy consumption in the SAR ADC. According to the architecture of the prior art SAR ADC, the only way to reducing the dynamic energy consumption therein seems to be reducing the basic capacitance C. However, reducing the basic capacitance C can deteriorate SNR (Signal to Noise Ratio), and thereby impact the resolution of the analog to digital conversion of the SAR ADC.

In view of the foregoing problem, a novel SAR analog to digital conversion architecture is needed to reduce the dynamic energy consumption without sacrificing SNR.

SUMMARY OF THE INVENTION

One objective of the present invention is to provide an SAR ADC capable of minimizing energy consumption by a novel capacitor array architecture, of which the largest capacitance is $2^{N-2}$ times of the smallest capacitance, wherein N represents the number of bits of the digital output of the SAR ADC.

Another objective of the present invention is to provide an SAR ADC capable of minimizing energy consumption by a novel input voltage sampling mode and a novel voltage comparison mode, wherein the novel voltage comparison mode enables most of the capacitors in two capacitor arrays to have a floating option.

Still another objective of the present invention is to provide an SAR ADC capable of minimizing energy consumption by a novel input voltage sampling mode and a novel voltage comparison mode, wherein both the novel input voltage sampling mode and the novel voltage comparison mode utilize a common mode voltage, which is lower than a reference voltage and higher than a ground voltage.

To attain the foregoing objectives, the present invention proposes an SAR ADC capable of reducing energy consumption, the SAR ADC including:

a comparator, having a positive input end, a negative input end, and a comparison output end;

a capacitor circuit, having a first capacitor array and a second capacitor array, and both the first capacitor array and the second capacitor array including N groups of capacitors, in which a first group has one capacitor with a capacitance of C, a second group has one capacitor with a capacitance of C, a third group has one capacitor with a capacitance of 2C, and a K-th group has K−2 capacitors with capacitances of 2C, $2^1C$, $2^2C$, ... $2^{K-3}C$, K=4 to N, and each of the capacitors of the first capacitor array has an electrode coupled to the positive input end of the comparator, and each of the capacitors of the second capacitor array has an electrode coupled to the negative input end of the comparator;

a sampling switch, having one side coupled to a positive input voltage and a negative input voltage, and the other side coupled to the positive input end and the negative input end of the comparator;

a logic circuit, having a bit input terminal, N bit output terminals, and a plurality of switch control output terminals, wherein the bit input terminal is coupled to the comparison output end of the comparator, and the switch control output terminals are used for outputting a plurality of switch control signals; and a voltage selecting circuit, used for making the other electrodes of the capacitors of the capacitor circuit floating or coupled to a reference voltage, a common mode voltage, or a ground voltage.

To make it easier for our examiner to understand the objective of the invention, its structure, innovative features, and performance, we use preferred embodiments together with the accompanying drawings for the detailed description of the invention.

BRIEF DESCRIPTION OF THE DRAWINGS

FIG. 7($b$) illustrates a second circuit of the bit value determination unit of FIG. 5 formed during a voltage comparison stage.

DETAILED DESCRIPTION OF THE PREFERRED EMBODIMENTS

The present invention will be described in more detail hereinafter with reference to the accompanying drawings that show the preferred embodiment of the invention.

Figure 1:
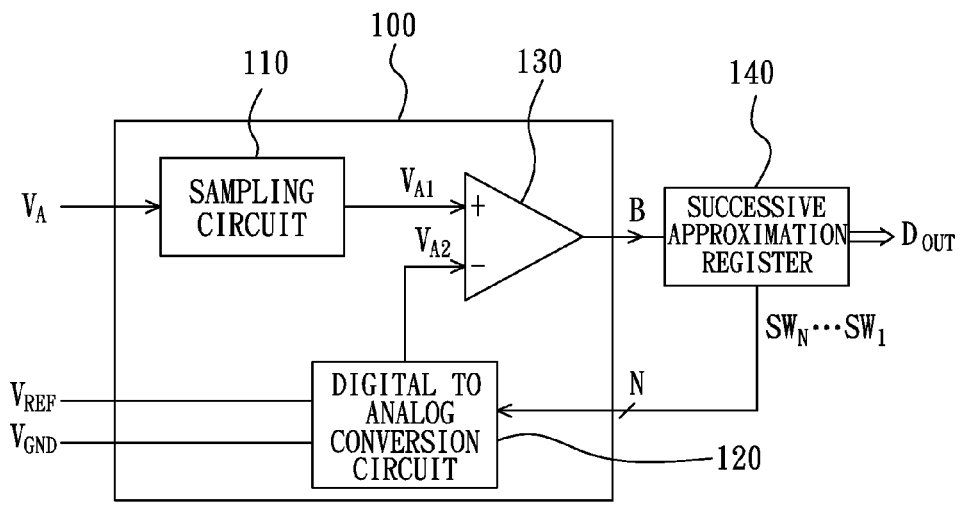
FIG. 1 illustrates the block diagram of a prior art N-bit SAR ADC.
Figure 2:
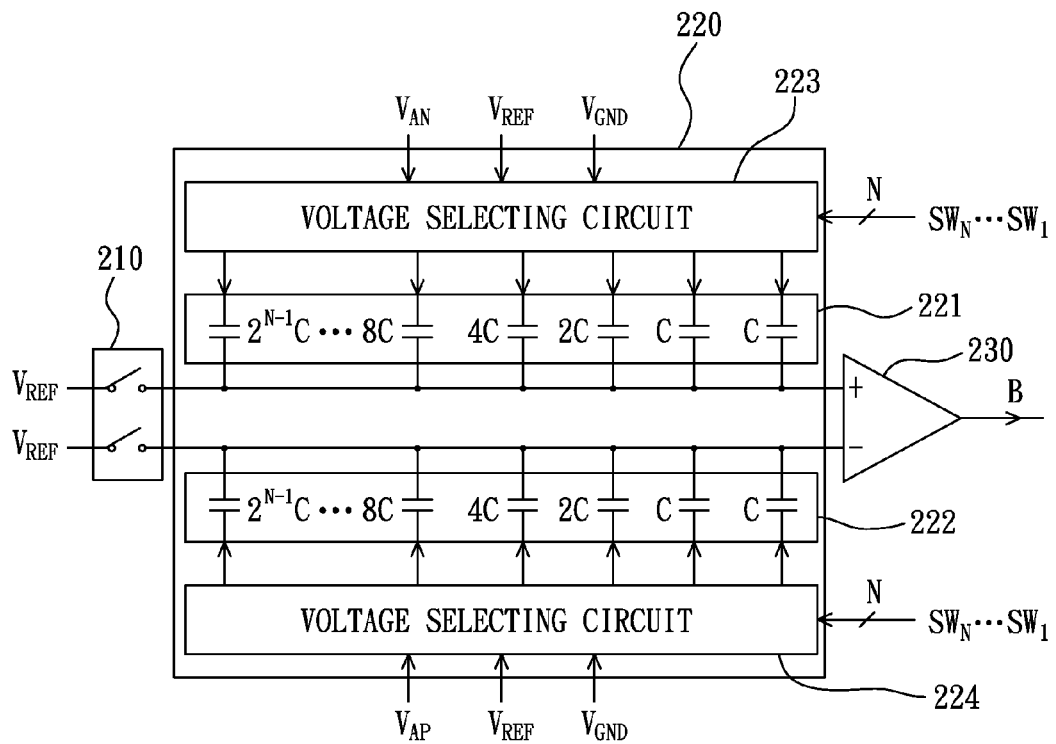
FIG. 2 illustrates the block diagram of a prior art bit value determination unit including a digital to analog conversion circuit.
Figure 3:
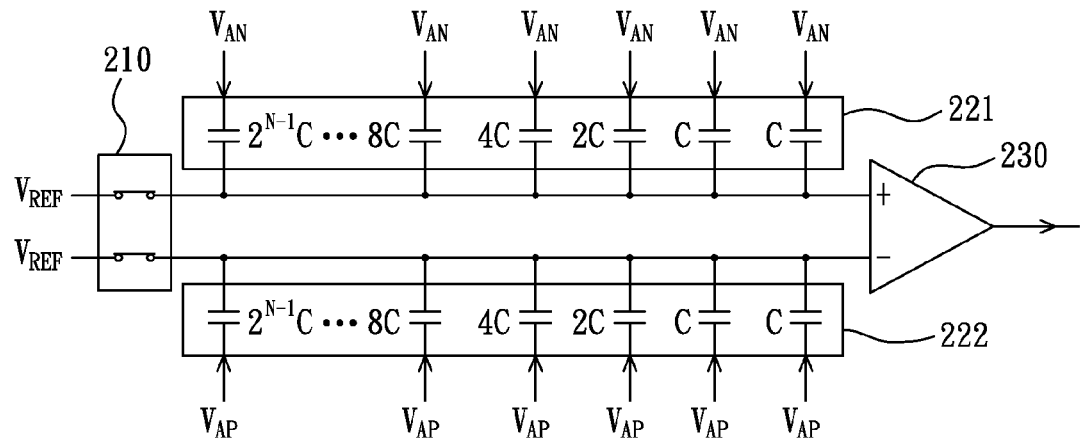
FIG. 3 illustrates a circuit of the prior art bit value determination unit of FIG. 2 formed in a sampling stage.
Figure 4:
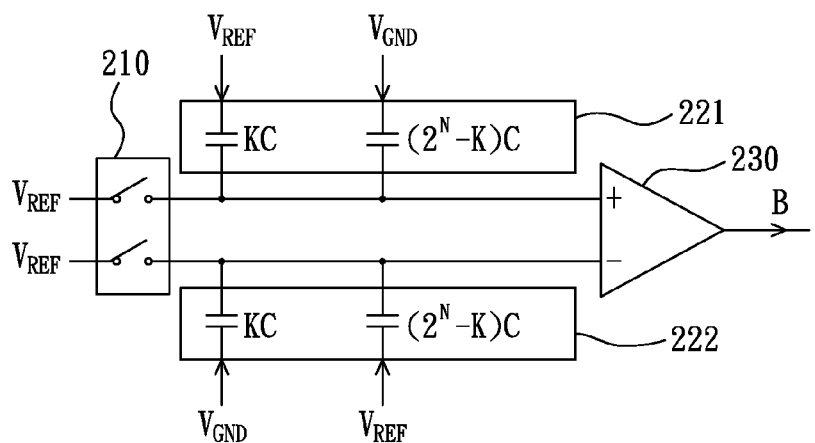
FIG. 4 illustrates another circuit of the prior art bit value determination unit of FIG. 2 formed in a voltage comparison stage.
Figure 5:
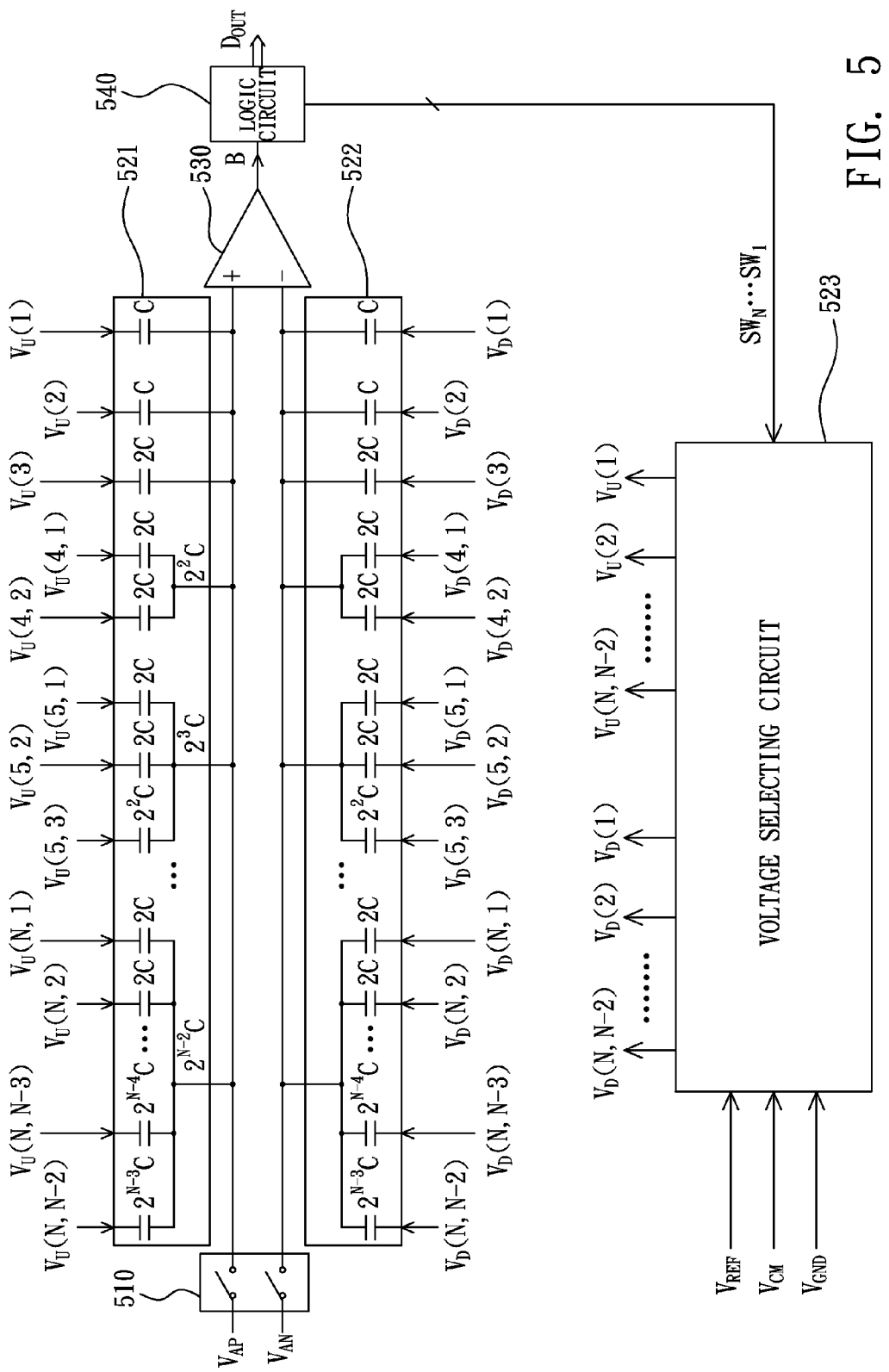
FIG. 5 illustrates the block diagram of an SAR ADC capable of reducing energy consumption according to a preferred embodiment of the present invention.

Please refer to FIG. 5, which illustrates the block diagram of an SAR ADC capable of reducing energy consumption according to a preferred embodiment of the present invention. As illustrated in FIG. 5, the SAR ADC includes a switch unit 510, a first capacitor array 521, a second capacitor array 522, a voltage selecting circuit 523, a comparator 530, and a logic circuit 540, wherein the switch unit 510, the first capacitor array 521, the second capacitor array 522, the voltage selecting circuit 523, and the comparator 530 are used to form a bit value determination unit.

The switch unit 510 has a pair of sampling switches, of which one side has a first contact and a second contact coupled respectively to a positive analog input voltage $V_{AP}$ and a negative analog input voltage $V_{AN}$, and the other side has a third contact and a fourth contact coupled respectively to the first capacitor array 521 and the second capacitor array 522.

Both the first capacitor array 521 and the second capacitor array 522 have N groups of capacitors, in which a first group has a capacitor with a capacitance of C, a second group has a capacitor with a capacitance of C, a third group has a capacitor with a capacitance of 2C, and a K-th group has K-2 capacitors with capacitances of 2C, $2^1$C, $2^2$C, ... $2^{K-3}$C, K=4 to N, and each of the capacitors of the first capacitor array 521 has an electrode coupled to the third contact of the switch unit 510, and the other electrodes of the capacitors of the first capacitor array 521 are bias contacts coupled respectively to bias signals $V_U(1), V_U(2), V_U(3), V_U(4,1), V_U(4,2), V_U(5,1), V_U(5,2), V_U(5,3) \ldots, V_U(N,1), V_U(N,2), \ldots V_U(N,N-3), V_U(N,N-2)$; and each of the capacitors of the second capacitor array 522 has an electrode coupled to the fourth contact of the switch unit 510, and the other electrodes of the capacitors of the second capacitor array 522 are bias contacts coupled respectively to bias signals $V_D(1), V_D(2), V_D(3), V_D(4,1), V_D(4,2), V_D(5,1), V_D(5,2), V_D(5,3) \ldots, V_D(N,1), V_D(N,2), \ldots V_D(N,N-3), V_D(N,N-2)$.

The voltage selecting circuit 523 is used for outputting the bias signals $V_U(1), V_U(2), V_U(3), V_U(4,1), V_U(4,2), V_U(5,1), V_U(5,2), V_U(5,3) \ldots, V_U(N,1), V_U(N,2), \ldots V_U(N,N-3), V_U(N,N-2)$ to the bias contacts of the first capacitor array 521, and the bias signals $V_D(1), V_D(2), V_D(3), V_D(4,1), V_D(4,2), V_D(5,1), V_D(5,2), V_D(5,3) \ldots, V_D(N,1), V_D(N,2), \ldots V_D(N,N-3), V_D(N,N-2)$ to the bias contacts of the second capacitor array 522 according to switch control signals $SW_N \ldots SW_1$, so as to make the bias contacts of the first capacitor array 521 and the second capacitor array 522 floating or coupled to a reference voltage $V_{REF}$, a common mode voltage $V_{CM}$, or a ground voltage $V_{GND}$. The common mode voltage $V_{CM}$ is lower than the reference voltage $V_{REF}$ and higher than the ground voltage $V_{GND}$, and is preferably equal to $V_{REF}/2$.

The comparator 530 has a positive input end, a negative input end, and an output end, wherein the positive input end is coupled to the third contact of the switch unit 510, the negative input end is coupled to the fourth contact of the switch unit 510, and the output end is for generating a bit output B according to the voltage difference between the positive input end and the negative input end.

The logic circuit 540 has a bit input terminal, N bit output terminals, and a plurality of switch control output terminals, wherein the bit input terminal is coupled to the output end of the comparator 530, the N bit output terminals are used for outputting a digital code $D_{OUT}$, the switch control output terminals are used for outputting the switch control signals $SW_N \ldots SW_1$, and the logic circuit 540 has a register for registering the digital code $D_{OUT}$.

Figure 6:
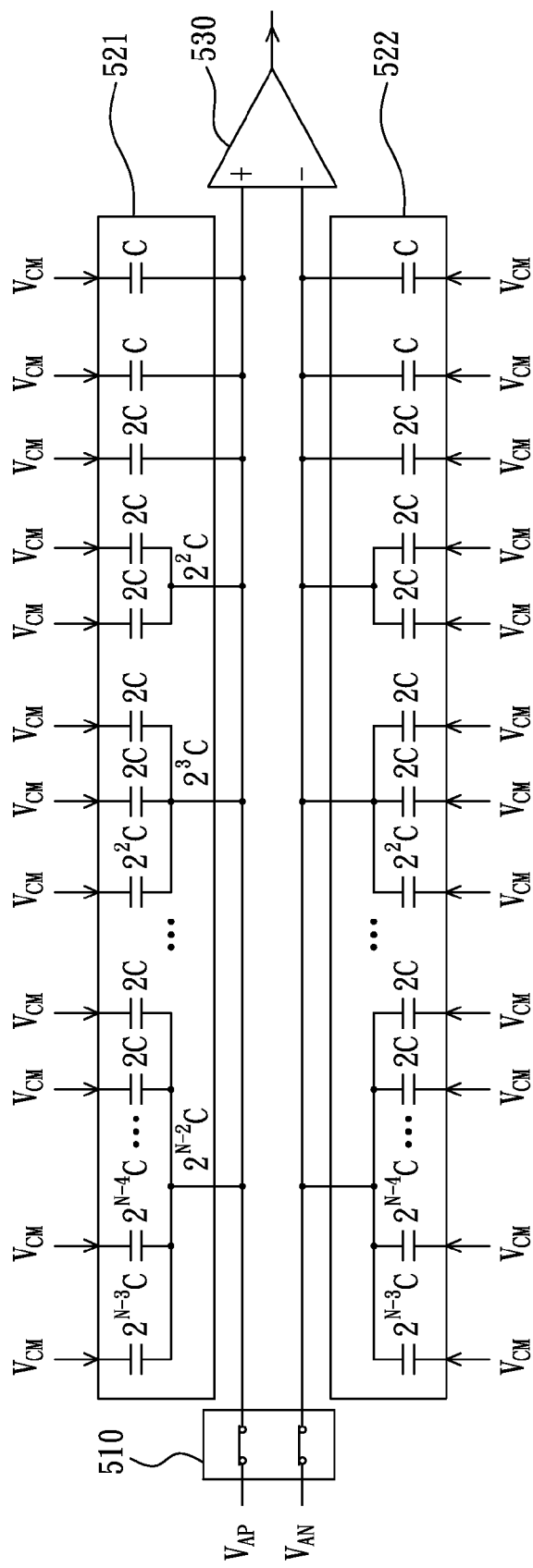
FIG. 6 illustrates the bit value determination unit of FIG. 5 operating in a sampling stage.

Please refer to FIG. 6, which illustrates the bit value determination unit of FIG. 5 operating in a sampling stage. As illustrated in FIG. 6, when in the sampling stage, the first capacitor array 521 has a common contact coupled to $V_{AP}$, the second capacitor array 522 has a common contact coupled to $V_{AN}$, and all the bias contacts of the first capacitor array 521 and the second capacitor array 522 are coupled to the common mode voltage $V_{CM}$. By the end of the sampling stage, the first capacitor array 521 will store a voltage of $(V_{AP}-V_{CM})$ the second capacitor array 522 will store a voltage of $(V_{AN}-V_{CM})$, and the comparator will see a voltage difference of $(V_{AP}-V_{AN}-0)$ between the positive input end and the negative input end of the comparator 530.

When the bit value determination unit of FIG. 5 is during a voltage comparison stage, a first circuit will be formed to compare $V_{AP}-V_{AN}$ with $((2m-1)/2^n)V_{REF}$ if $V_{AP}-V_{AN}>0$, and a second circuit will be formed to compare $V_{AP}-V_{AN}$ with $((1-2m)/2^n)V_{REF}$ if $V_{AP}-V_{AN}<0$, wherein m, n are positive integers, $m \leq 2^{n-1}$, and $n \leq N-1$.

Figure 7A:
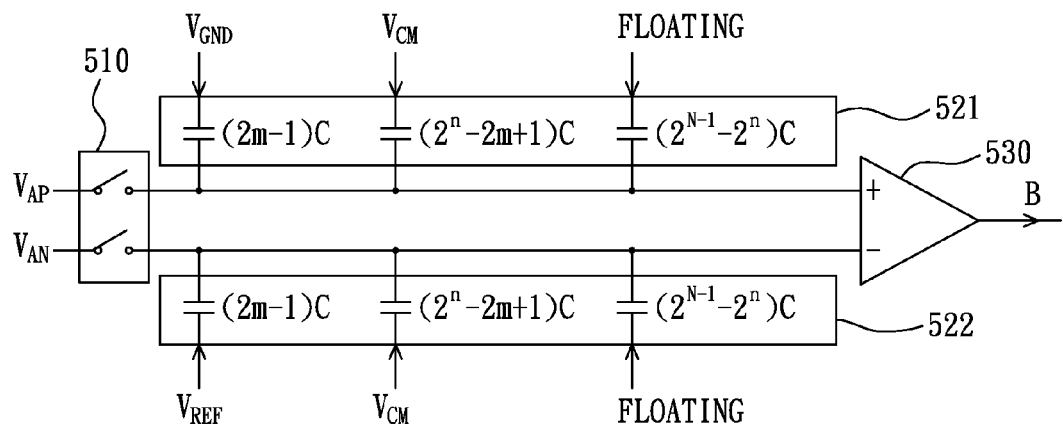
FIG. 7($a$) illustrates a first circuit of the bit value determination unit of FIG. 5 formed during a voltage comparison stage.

Please refer to FIG. 7($a$), which illustrates the first circuit. As illustrated in FIG. 7($a$), when the bit value determination unit forms the first circuit, the switch unit 510 is switched off; the first capacitor array 521 has a first equivalent capacitor with a capacitance of $(2m-1)C$, a second equivalent capacitor with a capacitance of $(2^n-2m+1)C$, and a third equivalent capacitor with a capacitance of $(2^{N-1}-2n)C$; and the second capacitor array 522 has a fourth equivalent capacitor with a capacitance of $(2m-1)C$, a fifth equivalent capacitor with a capacitance of $(2^n-2m+1)C$, and a sixth equivalent capacitor with a capacitance of $(2^{N-1}-2n)C$. The bias contact of the first equivalent capacitor is coupled to $V_{GND}$, the bias contact of the second equivalent capacitor is coupled to $V_{CM}$, the bias contact of the third equivalent capacitor is kept floating, the bias contact of the fourth equivalent capacitor is coupled to $V_{REF}$, the bias contact of the fifth equivalent capacitor is coupled to $V_{CM}$, and the bias contact of the sixth equivalent capacitor is kept floating.

In the first circuit, the comparator 530 will see a voltage of $V_{AP}-((2m-1)/2^n)V_{CM}$ at the positive input end, a voltage of $V_{AN}+((2m-1)/2^n)(V_{REF}-V_{CM})$ at the negative input end, that is, a voltage difference of $V_{AP}-V_{AN}-((2m-1)/2^n)V_{REF}$ between the positive input end and the negative input end. Taking N=4 as an example, wherein:

when (n, m)=(1,1), the voltage difference will be $V_{AP}-V_{AN}-(1/2)V_{REF}$;

when (n, m)=(2,1), the voltage difference will be $V_{AP}-V_{AN}-(1/4)V_{REF}$;

when (n, m)=(2,2), the voltage difference will be $V_{AP}-V_{AN}-(3/4)V_{REF}$;

when (n, m)=(3,1), the voltage difference will be $V_{AP}-V_{AN}-(1/8)V_{REF}$;

when (n, m)=(3,2), the voltage difference will be $V_{AP}-V_{AN}-(3/8)V_{REF}$;

when (n, m)=(3,3), the voltage difference will be $V_{AP}-V_{AN}-(5/8)V_{REF}$;

when (n, m)=(3,4), the voltage difference will be $V_{AP}-V_{AN}-(7/8)V_{REF}$.

Figure 7B:
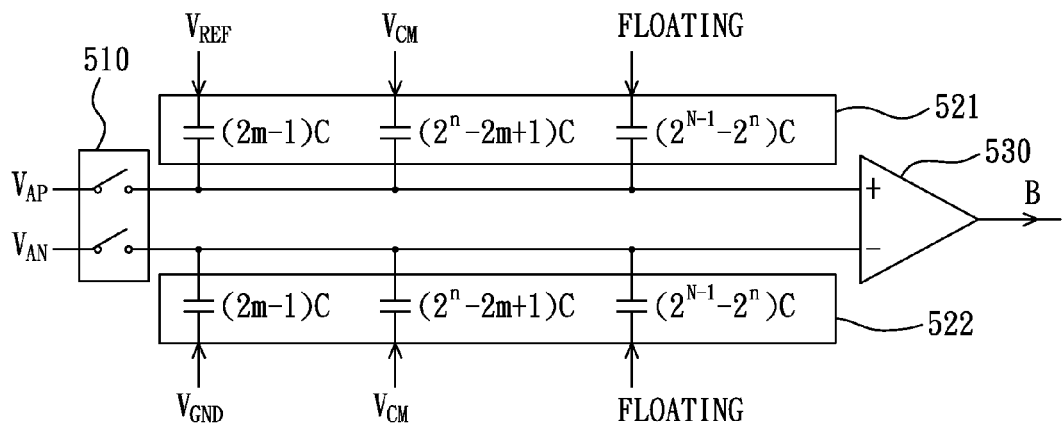

Please refer to FIG. 7(b), which illustrates the second circuit. As illustrated in FIG. 7(b), when the bit value determination unit forms the second circuit, the switch unit 510 is switched off; the first capacitor array 521 has a first equivalent capacitor with a capacitance of $(2m-1)C$, a second equivalent capacitor with a capacitance of $(2^n-2m+1)C$, and a third equivalent capacitor with a capacitance of $(2^{N-1}-2n)C$; and the second capacitor array 522 has a fourth equivalent capacitor with a capacitance of $(2m-1)C$, a fifth equivalent capacitor with a capacitance of $(2^n-2m+1)C$, and a sixth equivalent capacitor with a capacitance of $(2^{N-1}-2n)C$. The bias contact of the first equivalent capacitor is coupled to $V_{REF}$, the bias contact of the second equivalent capacitor is coupled to $V_{CM}$, the bias contact of the third equivalent capacitor is kept floating, the bias contact of the fourth equivalent capacitor is coupled to $V_{GND}$, the bias contact of the fifth equivalent capacitor is coupled to $V_{CM}$, and the bias contact of the sixth equivalent capacitor is kept floating.

In the second circuit, the comparator 530 will see a voltage of $V_{AP}+((2m-1)/2^n)(V_{REF}-V_{CM})$ at the positive input end, a voltage of $V_{AN}-((2m-1)/2^n)V_{CM}$ at the negative input end, that is, a voltage difference of $V_{AP}-V_{AN}-((1-2m)/2^n)V_{REF}$ between the positive input end and the negative input end. Taking N=4 as an example, wherein:

when (n, m)=(1,1), the voltage difference will be $V_{AP}-V_{AN}-(-1/2)V_{REF}$;

when (n, m)=(2,1), the voltage difference will be $V_{AP}-V_{AN}-(-1/4)V_{REF}$;

when (n, m)=(2,2), the voltage difference will be $V_{AP}-V_{AN}-(-3/4)V_{REF}$;

when (n, m)=(3,1), the voltage difference will be $V_{AP}-V_{AN}-(-1/8)V_{REF}$;

when (n, m)=(3,2), the voltage difference will be $V_{AP}-V_{AN}-(-3/8)V_{REF}$;

when (n, m)=(3,3), the voltage difference will be $V_{AP}-V_{AN}-(-5/8)V_{REF}$;

when (n, m)=(3,4), the voltage difference will be $V_{AP}-V_{AN}-(-7/8)V_{REF}$.

During the voltage comparison stage, if $V_{AP}-V_{AN}>0$, then (n, m) will be set in an order to first compare $V_{AP}-V_{AN}$ with $(1/2)V_{REF}$, and then compare $V_{AP}-V_{AN}$ with $(1/4)V_{REF}$ or $(3/4)V_{REF}$, and finally compare $V_{AP}-V_{AN}$ with $(1/8)V_{REF}$ or $(3/8)V_{REF}$ or $(5/8)V_{REF}$ or $(7/8)V_{REF}$. If $V_{AP}-V_{AN}<0$, then (n, m) will be set in an order to first compare $V_{AP}-V_{AN}$ with $(-1/2)V_{REF}$, and then compare $V_{AP}-V_{AN}$ with $(-1/4)V_{REF}$ or $(-3/4)V_{REF}$, and finally compare $V_{AP}-V_{AN}$ with $(-1/8)V_{REF}$ or $(-3/8)V_{REF}$ or $(-5/8)V_{REF}$ or $(-7/8)V_{REF}$.

Therefore, assume $V_{AP}-V_{AN}=(9/32)V_{REF}$, then the comparator 530 will output "1" because $(9/32)V_{REF}$ is higher than 0, and (n, m) will be set as (1,1); when (n, m)=(1,1), the comparator 530 will output "0" because $(9/32)V_{REF}-(1/2)V_{REF}$ is lower than 0, and (n, m) will be set as (2,1); when (n, m)=(2,1), the comparator 530 will output "1" because $(9/32)V_{REF}-(1/4)V_{REF}$ is higher than 0, and (n, m) will be set as (3,2); when (n, m)=(3,2), the comparator 530 will output "0" because $(9/32)V_{REF}-(3/8)V_{REF}$ is lower than 0, wherein, when (n, m)=(1,1), (the first equivalent capacitor, the second equivalent capacitor) will form a combination of (C, C); when (n, m)=(2,1), (the first equivalent capacitor, the second equivalent capacitor) will form a combination of (C, 3C); when (n, m)=(3,2), (the first equivalent capacitor, the second equivalent capacitor) will form a combination of (3C, 8C). In this manner, a digital output code (1010) corresponding to $(9/32)V_{REF}$ will be generated.

As can be seen in the above specification, the present invention has disclosed an SAR ADC capable of reducing energy consumption, which is different from the prior art as follows:

1. The capacitance of the largest capacitor of the present invention is $(2^{N-3}C)$, which is only one fourth of the corresponding capacitance $(2^{N-1}C)$ of the prior art SAR ADC; and the total capacitance of the present invention is $(2\times2^{N-1}C)$, which is only one half of that of the prior art, so the present invention is capable of greatly reducing the chip area.

2. The prior art SAR ADC uses the larger capacitors to perform voltage comparisons during the earlier period of a voltage comparison stage, while the present invention uses the smaller ones. As the voltage comparisons during the earlier period of a voltage comparison stage of an SAR analog-to-digital conversion (including comparing an analog input voltage with $\pm(1/2)V_{REF}$, and $\pm(1/4)V_{REF}$) involve larger voltage variations, therefore, by using smaller capacitors for voltage comparisons during the earlier period, the present invention can greatly reduce the charge flowing out of the reference voltage $V_{REF}$, and thereby greatly reduce the energy consumption.

3. The prior art SAR ADC has to use all the capacitors when performing the voltage comparisons, while the present invention is capable of letting some capacitors floating to further reduce energy consumption.

4. The prior art SAR ADC uses a reference voltage $V_{REF}$ and a ground voltage to define a comparison range from $-V_{REF}$ to $V_{REF}$, while the present invention inserts a common mode voltage between the reference voltage $V_{REF}$ and the ground voltage in defining the comparison range, so as to reduce the voltage across a capacitor circuit, and therefore further reduce the energy consumption.

The derived average energy consumption of the prior art N bits SAR ADC is as follows:

$$E_{Avg} = \sum_{i=1}^{N-1} 2^{N+1-2i} \times (2^i - 1) C V_{REF}^2$$

Taking N=10 as an example, the average energy consumption of the prior art is equal to 1363.33 $CV_{REF}^2$; while the average energy consumption of the present invention is as follows:

$$E_{Avg} \; 0.25 - \frac{1}{8 \times 2^{N-2}} + \frac{1}{8} \times \sum_{i=3}^{N-1} \left( 2^{N-i} - \frac{1}{2^{i-2}} \right) C V_{REF}^2$$

With N=10, the average energy consumption of the present invention is equal to 31.88 $CV_{REF}^2$. Comparing to the prior art, the present invention saves 97.66% of the energy consumption.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance than the conventional structure and further complies with the patent application requirements and is submitted to the Patent and Trademark Office for review and granting of the commensurate patent rights.

What is claimed is:

1. An SAR ADC capable of reducing energy consumption, comprising:
    a comparator, having a positive input end, a negative input end, and a comparison output end;
    a capacitor circuit, having a first capacitor array and a second capacitor array, and both said first capacitor array and said second capacitor array including N groups of capacitors, in which a first group has one capacitor with a capacitance of C, a second group has one capacitor with a capacitance of C, a third group has one capacitor with a capacitance of 2C, and a K-th group has K−2 capacitors with capacitances of 2C, $2^1$C, $2^2$C, ... $2^{K-3}$C, K=4 to N, and each of said capacitors of said first capacitor array has an electrode coupled to said positive input end of said comparator, and each of said capacitors of said second capacitor array has an electrode coupled to said negative input end of said comparator;
    a sampling switch, having one side coupled to a positive input voltage and a negative input voltage, and the other side coupled to said positive input end and said negative input end of said comparator;
    a logic circuit, having a bit input terminal, N bit output terminals, and a plurality of switch control output terminals, wherein said bit input terminal is coupled to said comparison output end of said comparator, and said switch control output terminals are used for outputting a plurality of switch control signals; and
    a voltage selecting circuit, used for making the other electrodes of said capacitors of said capacitor circuit floating or coupled to a reference voltage, a common mode voltage, or a ground voltage.

2. The SAR ADC capable of reducing energy consumption as claim 1, wherein said logic circuit further comprises a register.

3. The SAR ADC capable of reducing energy consumption as claim 1, wherein said common mode voltage is lower than said reference voltage and higher than said ground voltage.

4. An SAR ADC capable of reducing energy consumption, comprising:
    a comparator, having a positive input end, a negative input end, and a comparison output end;
    a capacitor circuit, having a first capacitor array and a second capacitor array;
    a pair of sampling switches, having one side coupled to a positive input voltage and a negative input voltage, and the other side coupled to said positive input end and said negative input end of said comparator;
    a logic circuit, having a bit input terminal, N bit output terminals, and a plurality of switch control output terminals, wherein said bit input terminal is coupled to said comparison output end of said comparator, and said switch control output terminals are used for outputting a plurality of switch control signals; and
    a voltage selecting circuit, used for executing the following operations according to said switch control signals:
    programming said first capacitor array to provide a first equivalent capacitor having a capacitance of (2m−1)C, and a second equivalent capacitor having a capacitance of ($2^n$−2m+1)C, wherein said first equivalent capacitor has an electrode coupled to said positive input end of said comparator, and the other electrode coupled to a reference voltage or a ground voltage, and said second equivalent capacitor has an electrode coupled to said positive input end of said comparator, and the other electrode coupled to a common mode voltage; and
    programming said second capacitor array to provide a fourth equivalent capacitor having a capacitance of (2m−1)C, and a fifth equivalent capacitor having a capacitance of ($2^n$−2m+1)C, wherein said fourth equivalent capacitor has an electrode coupled to said negative input end of said comparator, and the other electrode coupled to said ground voltage or said reference voltage, and said fifth equivalent capacitor has an electrode coupled to said negative input end of said comparator, and the other electrode coupled to said common mode voltage, wherein n, m are positive integers, and m≦$2^{n-1}$.

5. The SAR ADC capable of reducing energy consumption as claim 4, wherein said logic circuit further comprises a register.

6. The SAR ADC capable of reducing energy consumption as claim 4, wherein said common mode voltage is lower than said reference voltage and higher than said ground voltage.

7. An SAR ADC capable of reducing energy consumption, comprising:
    a comparator, having a positive input end, a negative input end, and a comparison output end, wherein said comparison output end is used for providing a bit output; and
    a voltage selecting circuit, used for executing the following operations according to a plurality of switch control signals:
    programming a first capacitor array to provide a first equivalent capacitor having a capacitance of (2m−1)C, a second equivalent capacitor having a capacitance of ($2^n$−2m+1)C, and a third equivalent capacitor having a capacitance of ($2^{N-1}$−$2^n$)C, wherein said first equivalent capacitor has an electrode coupled to said positive input end of said comparator, and the other electrode coupled to a reference voltage or a ground voltage, said second equivalent capacitor has an electrode coupled to said positive input end of said comparator, and the other electrode coupled to a common mode voltage, and said third equivalent capacitor has an electrode coupled to said positive input end of said comparator, and the other electrode kept floating; and programming a second capacitor array to provide a fourth equivalent capacitor having a capacitance of $(2m-1)C$, a fifth equivalent capacitor having a capacitance of $(2^n-2m+1)C$, and a sixth equivalent capacitor having a capacitance of $(2^{N-1}-2^n)C$, wherein said fourth equivalent capacitor has an electrode coupled to said negative input end of said comparator, and the other electrode coupled to said ground voltage or said reference voltage, said fifth equivalent capacitor has an electrode coupled to said negative input end of said comparator, and the other electrode coupled to said common mode voltage, and said sixth equivalent capacitor has an electrode coupled to said negative input end of said comparator, and the other electrode kept floating, wherein n, m, N are positive integers, and $m \leq 2^{n-1}$ and $n \leq N-1$.

* * * * *